(12) United States Patent
Wildenberg et al.

(10) Patent No.: US 11,106,141 B2
(45) Date of Patent: Aug. 31, 2021

(54) OPTIMIZING A SEQUENCE OF PROCESSES FOR MANUFACTURING OF PRODUCT UNITS

(71) Applicant: ASML NETHERLANDS B.V., Veldhoven (NL)

(72) Inventors: Jochem Sebastiaan Wildenberg, Aarle-Rixtel (NL); Marinus Jochemsen, Veldhoven (NL); Erik Jensen, Veldhoven (NL); Erik Johannes Maria Wallerbos, Helmond (NL); Cornelis Johannes Rijnierse, Eindhoven (NL); Bijoy Rajasekharan, Eindhoven (NL); Roy Werkman, Eindhoven (NL); Jurgen Johannes Henderikus Maria Schoonus, Nuenen (NL)

(73) Assignee: ASML Netherlands B.V., Veldhoven (NL)

( * ) Notice: Subject to any disclaimer, the term of this patent is extended or adjusted under 35 U.S.C. 154(b) by 134 days.

(21) Appl. No.: 16/495,119

(22) PCT Filed: Mar. 28, 2018

(86) PCT No.: PCT/EP2018/057961
§ 371 (c)(1),
(2) Date: Sep. 18, 2019

(87) PCT Pub. No.: WO2018/197144
PCT Pub. Date: Nov. 1, 2018

(65) Prior Publication Data
US 2020/0026200 A1    Jan. 23, 2020

(30) Foreign Application Priority Data
Apr. 28, 2017  (EP) .................... 17168734

(51) Int. Cl.
*G03F 7/20*  (2006.01)

(52) U.S. Cl.
CPC .......... *G03F 7/70525* (2013.01); *G03F 7/705* (2013.01); *G03F 7/70625* (2013.01);
(Continued)

(58) Field of Classification Search
CPC .. G03F 7/705; G03F 7/70525; G03F 7/70625; G03F 7/70633; G05B 19/41865; G05B 2219/32291; G05B 2219/45031
See application file for complete search history.

(56) References Cited

U.S. PATENT DOCUMENTS

| 6,622,059 B1 | 9/2003 | Toprac et al. |
| 2006/0009872 A1 | 1/2006 | Prager et al. |

(Continued)

FOREIGN PATENT DOCUMENTS

| CN | 1460387 | 12/2003 |
| CN | 102054074 | 5/2011 |

(Continued)

OTHER PUBLICATIONS

Machine translation of TW 201704849, Feb. 2017.*

(Continued)

*Primary Examiner* — Peter B Kim
(74) *Attorney, Agent, or Firm* — Pillsbury Winthrop Shaw Pittman LLP

(57) ABSTRACT

A method for optimizing a sequence of processes for manufacturing of product units, includes: associating measurement results of performance parameters (e.g., fingerprints) with the recorded process characteristics (e.g., context); obtaining a characteristic (e.g., context) of a previous process (e.g. deposition) in the sequence already performed on a product unit; obtaining a characteristic (e.g., context) of a subsequent process (e.g., exposure) in the sequence to be
(Continued)

performed on the product unit; determining a predicted performance parameter (e.g., fingerprint) of the product unit associated with the sequence of previous and subsequent processes by using the obtained characteristics to retrieve measurement results of the performance parameters (e.g., fingerprints) corresponding to the recorded characteristics; and determining corrections to be applied to future processes (e.g. exposure, etch) in the sequence to be performed on the product unit, based on the determined predicted performance parameter.

21 Claims, 4 Drawing Sheets

(52) U.S. Cl.
CPC ............... *G03F 7/70633* (2013.01); *G05B 2219/32291* (2013.01); *G05B 2219/45031* (2013.01)

(56) References Cited

U.S. PATENT DOCUMENTS

| | | |
|---|---|---|
| 2016/0062226 A1 | 3/2016 | Lin et al. |
| 2016/0266484 A1 | 9/2016 | Furubayashi et al. |
| 2016/0313651 A1 | 10/2016 | Middlebrooks et al. |

FOREIGN PATENT DOCUMENTS

| | | |
|---|---|---|
| CN | 102147820 | 8/2011 |
| CN | 103970922 | 8/2014 |
| EP | 1253497 | 10/2002 |
| JP | 2004524637 | 8/2004 |
| JP | 2007305655 | 11/2007 |
| JP | 2010118404 | 5/2010 |
| JP | 2010258356 | 11/2010 |
| JP | 201666093 | 4/2016 |
| TW | 201528016 | 7/2015 |
| TW | 201530333 | 8/2015 |
| TW | 201704849 | 2/2017 |
| WO | 2015049087 | 4/2015 |
| WO | 2017060080 | 4/2017 |

OTHER PUBLICATIONS

Machine translation of TW 201530333, Aug. 2015.*
Machine translation of JP 2010-258356, Nov. 2010.*
Machine translation of JP 2007-305655, Nov. 2007.*
Japanese Office Action issued in corresponding Japanese Patent Application No. 2019-558581, dated Jan. 12, 2021.
Chinese Office Action issued in corresponding Chinese Patent Application No. 2018800274296, dated Feb. 26, 2021.
Korean Office Action issued in corresponding Korean Patent Application No. 10-2019-7035044, dated Feb. 10, 2021.
International Search Report and Written Opinion issued in corresponding PCT Patent Application No. PCT/EP2018/057961, dated Jul. 26, 2018.
Taiwanese Office Action issued in corresponding Taiwanese Patent Application No. 107112965, dated Dec. 12, 2018.

* cited by examiner

OPTIMIZING A SEQUENCE OF PROCESSES FOR MANUFACTURING OF PRODUCT UNITS

CROSS-REFERENCE TO RELATED APPLICATIONS

This application is the U.S. national phase entry of PCT Patent Application No. PCT/EP2018/057961, which was filed on Mar. 28, 2018, which claims the benefit of priority of European patent application no. 17168734.6, which was filed on Apr. 28, 2017 and which is incorporated herein in its entirety by reference.

BACKGROUND

Field of the Invention

The present invention relates to a method of optimizing a sequence of processes for manufacturing of product units, usable, for example, in the manufacturing of semiconductor device wafers by lithographic techniques. The present invention also relates to associated computer programs and computer program products, and apparatus.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields". Wafers are processed in batches or lots through various apparatuses in the semiconductor fabrication facility (fab). The integrated circuit is built up layer by layer with a lithographic step performed by a lithographic apparatus at each layer and other fab processes being performed in between lithographic steps.

Before the imaging step, various chemical and/or physical processing steps are used to form and prepare the layer for patterning. After the imaging step defines the pattern, further chemical and/or physical processing steps work through the pattern to create functional features of the integrated circuit. The imaging and processing steps are repeated in a multi-layer process to build integrated circuit.

The accurate placement of patterns on the substrate is a chief challenge for reducing the size of circuit components and other products that may be produced by lithography. In particular, the challenge of measuring accurately the features on a substrate which have already been laid down is a critical step in being able to align successive layers of features in superposition accurately enough to produce working devices with a high yield. So-called overlay should, in general, be achieved within a few tens of nanometers in today's submicron semiconductor devices, down to a few nanometers in the most critical layers.

Consequently, modern lithography apparatuses involve extensive measurement or 'mapping' operations prior to the step of actually exposing or otherwise patterning the substrate at a target location. So-called advanced alignment models have been and continue to be developed to model and correct more accurately non-linear distortions of the wafer 'grid' that are caused by processing steps and/or by the lithographic apparatus itself. Not all distortions are correctable during exposure, however, and it remains important to trace and eliminate as many causes of such distortions as possible.

Modern multi-layer lithographic processes and products are so complex that issues due to processing are difficult to trace back to the root cause. Monitoring of wafer integrity and design of an appropriate correction strategy is therefore a time-consuming and laborious exercise.

International Patent Application WO 2015049087, which is incorporated by reference herein in its entirety, discloses a method of obtaining diagnostic information relating to an industrial process. Alignment data or other measurements are made at stages during the performance of the lithographic process to obtain object data representing positional deviation or other parameters measured at points spatially distributed across each wafer. Overlay and alignment residuals typically show patterns across the wafer, known as fingerprints. This object data is used to obtain diagnostic information by performing a multivariate analysis to decompose the set of vectors representing the wafers in multidimensional space into one or more component vectors. Diagnostic information about the industrial process is extracted using the component vectors. The performance of the industrial process for subsequent wafers can be controlled based on the extracted diagnostic information.

In semiconductor manufacture, the Critical Dimension (CD) performance parameter fingerprint can be corrected using a simple control loop. Typically a feedback mechanism controls the average dose per wafer, using the scanner (a type of lithographic apparatus) as an actuator. Similarly, for the overlay performance parameter overlay, fingerprints induced by processing tools can be corrected by adjusting scanner actuators.

However, a drawback with such approaches is that the granularity of corrections is still limited. Each wafer from a lot gets the same correction, i.e. there are lot level corrections. What is more, only the most suitable one of available actuators (e.g. scanner or etcher) is used to correct for disturbance fingerprints.

Wafer-to-wafer variations exist within a lot and optimization of the whole litho process (CMP/deposit/coat/expose/develop/etch/deposit/ . . . , etc.) is not optimal in view of the available sensor and metrology data and degrees of freedom of actuators for making corrections.

SUMMARY

The inventors have devised a way to optimize a sequence of processes. It may be used, for example, in the manufacture of devices by lithographic techniques to reduce the adverse effects of fingerprints such as deposition thickness variation and etcher fingerprint on after-etch CD, hence increasing yield, while avoiding or at least mitigating one or more of the associated problems mentioned above.

The invention in a first aspect provides a method for optimizing a sequence of processes for manufacturing of product units, the method comprising:
  (a) obtaining a characteristic of a previous process in the sequence already performed on a product unit;
  (b) obtaining a characteristic of a subsequent process in the sequence to be performed on the product unit;

(c) determining, using the obtained characteristics, a predicted performance parameter of the product unit associated with the sequence of previous and subsequent processes; and (d) determining a first correction to a first future process in the sequence to be performed on the product unit, based on the determined predicted performance parameter.

The step (c) of determining the predicted performance parameter may comprise the steps:

(c1) obtaining recorded characteristics of processes in the sequence performed on a plurality of product units;

(c2) obtaining measurement results of performance parameters for each product unit out of the plurality of product units;

(c3) associating the measurement results of the performance parameters with the respective recorded characteristics; and (c4) determining a predicted performance parameter of the product unit associated with the sequence of previous and subsequent processes by using the obtained characteristics to retrieve measurement results of the performance parameters corresponding to the recorded characteristics.

The invention in a second aspect provides a computer program comprising computer readable instructions which, when run on suitable computer apparatus, cause the computer apparatus to perform the method of the first aspect.

The invention in a third aspect provides a computer program product comprising the computer program of the second aspect.

The invention in a fourth aspect provides an apparatus specifically adapted to carry out the steps of the method of the first aspect.

BRIEF DESCRIPTION OF THE DRAWINGS/FIGURES

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
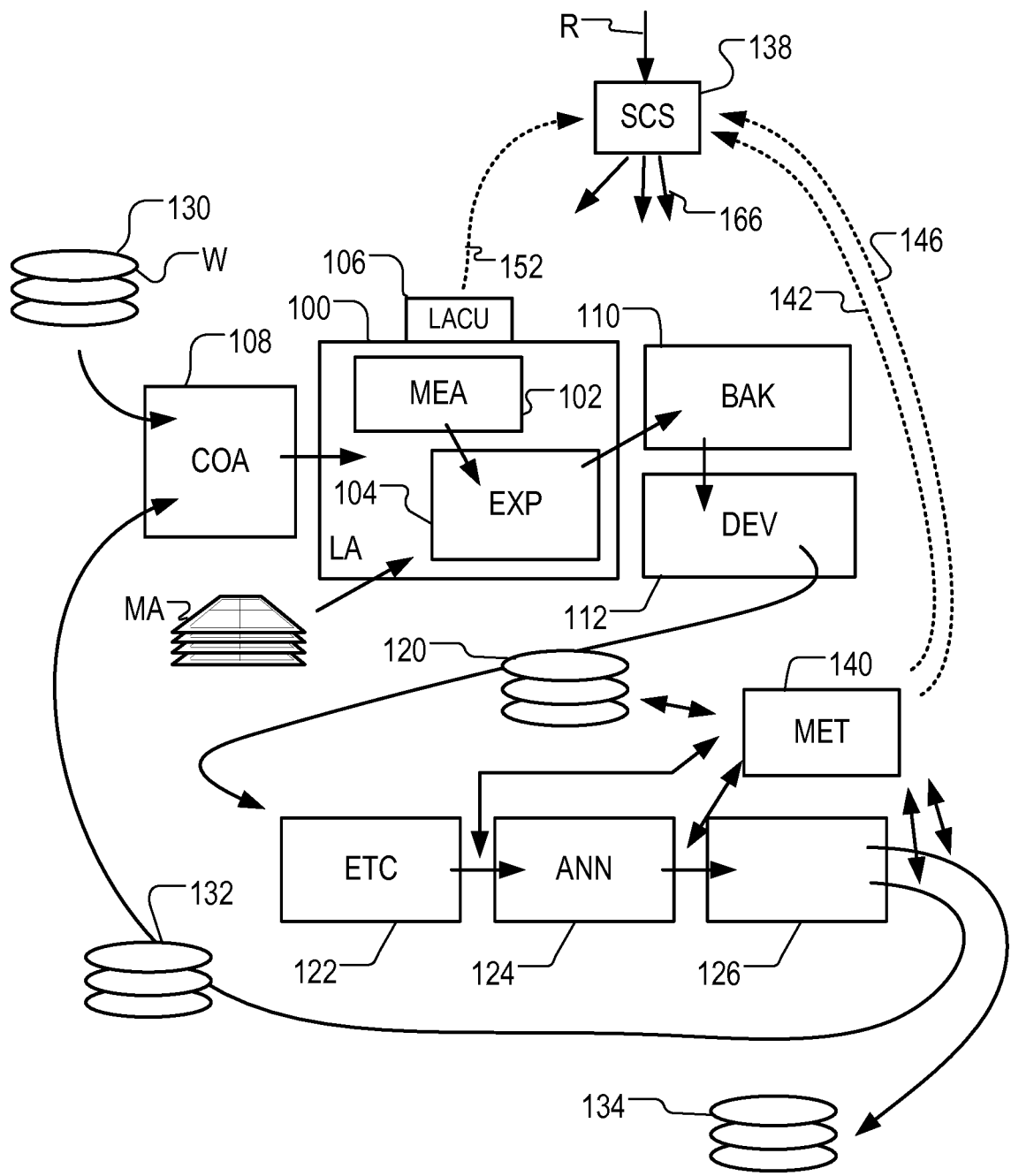
FIG. 1 depicts a lithographic apparatus together with other tools forming a production facility for semiconductor devices.

FIG. 1 at 100 shows a lithographic apparatus LA as part of an industrial facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 100 for short), a measurement station MEA is shown at 102 and an exposure station EXP is shown at 104. A control unit LACU is shown at 106. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU controls all the movements and measurements of various actuators and sensors, causing the apparatus to receive substrates W and reticles MA and to implement the patterning operations. LACU also includes signal processing and computing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy.

The lithographic apparatus LA may be of a so-called dual stage type which has two substrate tables, each with a positioning system controlled by the control unit LACU.

While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. When lithographic apparatus LA is of a so-called dual stage type which has two substrate tables, the exposure station and the measurement station may be distinct locations between which the substrate tables can be exchanged. This is only one possible arrangement, however, and the measurement station and exposure station need not be so distinct. For example, it is known to have a single substrate table, to which a measurement stage is temporarily coupled during the pre-exposure measuring phase. The present disclosure is not limited to either type of system.

Within the production facility, apparatus 100 forms part of a "litho cell" or "litho cluster" that contains also a coating apparatus 108 (COA) for applying photosensitive resist and other coatings to substrates W for patterning by the apparatus 100. At an output side of apparatus 100, a baking apparatus 110 and developing apparatus 112 are provided for developing the exposed pattern into a physical resist pattern. Between all of these apparatuses, substrate handling systems take care of supporting the substrates and transferring them from one piece of apparatus to the next. These apparatuses, which are often collectively referred to as the "track", are under the control of a track control unit which is itself controlled by a supervisory control system SCS, which also controls the lithographic apparatus via lithographic apparatus control unit LACU. Thus, the different apparatuses can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 120 are transferred to other processing apparatuses such as are illustrated at 122, 124, 126. A wide range of processing steps is implemented by various apparatuses in a typical manufacturing facility. For the sake of example, apparatus 122 in this embodiment is an etching station (ETC), and apparatus 124 performs a post-etch thermal annealing step (ANN). Further physical and/or chemical processing steps are applied in further apparatuses, 126, etc. Numerous types of operation can be required to make a real device, such as deposition of material (DEP), modification of surface material characteristics (oxidation, doping, ion implantation etc.), chemical-mechanical polishing (CMP), and so forth. The apparatus 126 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 130 arriving at the litho cluster may be newly prepared substrates, or they may be substrates that have been processed previously in this cluster or in another apparatus entirely. Similarly, depending on the required processing, substrates 132 on leaving apparatus 126 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 126 used at each layer may be completely different in type. Further, even where the processing steps to be applied by the apparatus 126 are nominally the same, in a large facility, there may be several supposedly identical machines working in parallel to perform the step 126 on different substrates. Small differences in set-up or faults between these machines can mean that they influence different substrates in different ways. Even steps that are relatively common to each layer, such as etching (apparatus 122) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system MET which receives some or all of the substrates W that have been processed in the litho cell. Metrology results are provided directly or indirectly to the supervisory control system (SCS) 138. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 140 (MET) which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 120 prior to etching in the apparatus 122. Using metrology apparatus 140, it may be determined, for example, that important performance parameters such as overlay or critical dimension (CD) do not meet specified accuracy requirements in the developed resist. Prior to the etching step, the opportunity exists to strip the developed resist and reprocess the substrates 120 through the litho cluster. As is also well known, the metrology results 142 from the apparatus 140 can be used to maintain accurate performance of the patterning operations in the litho cluster, by supervisory control system SCS and/or control unit LACU 106 making small adjustments 166 over time, thereby minimizing the risk of products being made out-of-specification, and requiring re-work. Of course, metrology apparatus 140 and/or other metrology apparatuses (not shown) can be applied to measure properties of the processed substrates 132, 134, and incoming substrates 130.

Conventionally, semiconductor manufacturers make a process thread and try and keep the wafers in that process thread. A thread is the sequence of specific tools that a wafer is processed in as it progresses through a sequence of processes in the fab. Then all wafers get a constant fingerprint and a per-lot correction can be made to control the fingerprint. In order to get the best throughput it is best not to dedicate any of the process flows. In practice it is not possible to process every wafer with the same tools. Especially not if we consider each chamber in the etch tool as a separate tool, because wafers in a lot can be split across, for example, six etch chambers. Each chamber may cause a slightly different fingerprint. In for example semiconductor memory device processing, where throughput is very important, different wafers from within a lot can be processed through different etch tools as well as through different chambers of one etch tool.

Embodiments of the present invention decouple the contributions of individual processes to a performance parameter (e.g. after-etch overlay and CD fingerprint). This is be done by recording performance parameter results (fingerprints) obtained for many different threads. The performance parameter results (fingerprints) are generated within a time scale less than stability processes. The method may use statistical methods to retrieve a context to performance model. For example, the thread: coat tool #1+scanner tool #3+etch tool #1+deposit tool #12 is used by a CD uniformity optimization application to retrieve the performance model CD(1,3,1,12) to predict a fingerprint.

When there is a wide variation in context (e.g. threads per wafer) one can relate performance measurements (overlay/CD fingerprints) to specific context parameters (e.g. tool ID (#), tool parameters, etc.). A context-to-performance model is created which is able to derive from a certain context a predicted (after etch) performance of the lithographic process as a whole. The creation of such a model is described below with reference to FIG. 2.

Such a context-to-performance model is of great utility as it allows process (e.g. scanner and etch) corrections on subsequent process steps (e.g. the next layers).

Once the model is created, it can be used to correct fingerprints on wafers in progress in the fab. Having recorded the previous thread of a wafer and predicted the contribution of the processes including a post-expose process, it is possible to calculate an exposure correction taking into account the contribution to CD/overlay of a) the history of substrate and b) future processing.

For example, with the context up to process N−1 known we can predicted overlay fingerprint delta due to processes N+1, . . . we can then correct process N (exposure) based on the predicted overlay fingerprint delta and anticipated correction applied to process N+M (etch).

The actuation that applies the corrections per process thus evolves based on the history of the wafer and future process characteristics. All corrections may be on a per wafer basis, minimizing wafer-to-wafer variations. Adopting this strategy, the full benefit of multi-tool correction potential can be obtained at a highly granular scale (per wafer, per group of wafers having similar contexts).

Figure 2:
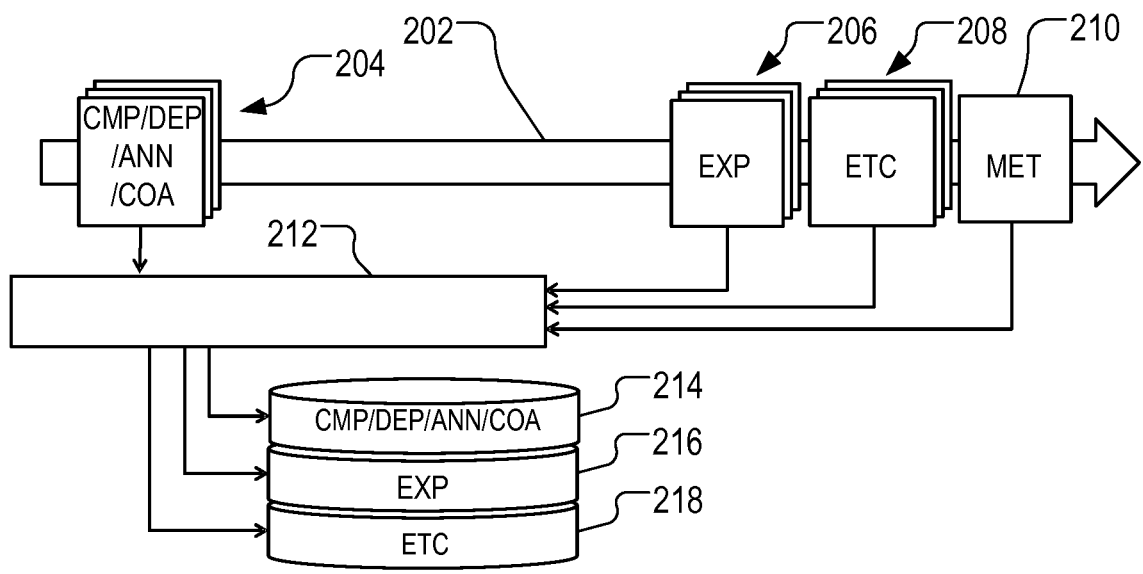
FIG. 2 depicts a high-level flow diagram of measurement results of performance parameters being associated with recorded characteristics of a sequence of processes, in accordance with an embodiment of the present invention.

FIG. 2 depicts a high-level flow diagram of measurement results of performance parameters being associated with recorded characteristics of a sequence of processes for manufacturing of product units. In this example, shown in FIGS. 2 and 3, the product units are wafers of semiconductor devices. The characteristics of the processes are context data. The context data represents one or more parameters of processing of product units, such as a tool identifier or measured process parameter. Also, in this example, the measurement results of performance parameters are measured fingerprints. Thus the performance parameter comprises a fingerprint of variation across wafers of object data representing one or more parameters measured across wafers.

With reference to FIG. 2, a sequence of processes 202 is performed on wafers. The processes include at 204, for example, chemical-mechanical polish (CMP), deposition (DEP), thermal anneal (ANN) and resist coat (COA). The processes also include: at 206, exposure (EXP) on a plurality of scanner tools; at 208, etch (ETC) on a plurality of etch tools (including different etch chambers); and at 210 metrology (MET), such as after-etch inspection (AEI) for CD and overlay measurement. These processes correspond to those shown in FIG. 1 having the same reference labels (COA, EXP, ETC, and so on).

A setup application 212 obtains recorded characteristics of processes 204 (e.g. CMP/DEP/ANN/COA), 206 (EXP) and 208 (ETC) in the sequence 202 performed on many wafers. For example, deposition context is obtained from processes 204, exposure context from process 206 and etch context from process 208. Deposition fingerprints are used as an example for the application of the present invention because no film thickness is available. The amorphous carbon layer that is deposited may vary in thickness across wafers and from deposition chamber to deposition chamber. Measurement tools cannot distinguish between thickness and hardness which relates to the thin-film optical properties of refractive index (n) and extinction coefficient (k).

The setup application 212 obtains measurement results of performance parameters for each wafer out of the many wafers for which the context has been recorded. For example, after-etch inspection CD (AEI CD) is obtained from a metrology tool 210.

The setup application 212 obtains the AEI CDs with the respective recorded context. For example, this is done by calculating deposition, scanner and etch fingerprints and storing the fingerprints per context in one or more databases. Thus 214 is a database with CD fingerprint per CMP/DEP/ANN/COA context, 216 is a database with CD fingerprint per exposure context, and 218 is a database with etch chamber fingerprint per exposure context. Although depicted as three separate databases, other suitable storage schemes may be used, such as storing in one database or in a matrix in a computer memory.

Figure 3:
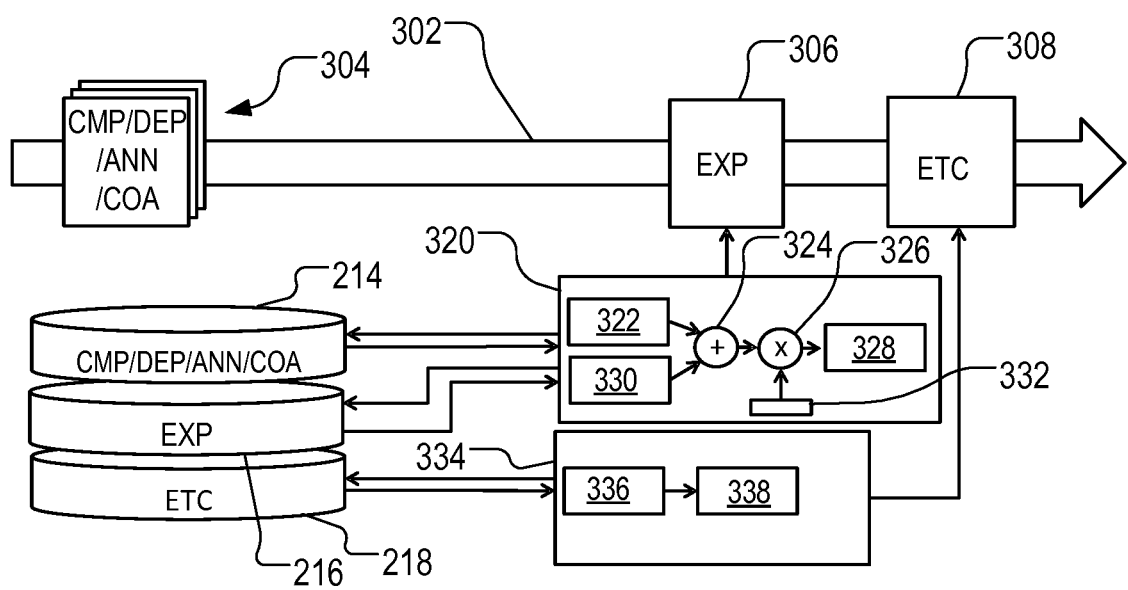
FIG. 3 depicts a high-level flow diagram of determining and applying corrections to two processes in the sequence of FIG. 2, in accordance with an embodiment of the present invention.

FIG. 3 depicts a high-level flow diagram of determining and applying corrections to two processes for manufacturing of wafers in the sequence 202 of FIG. 2. The determining of the corrections is based on characteristics of both a previous process 304 performed on wafers and a future process 306, 308 to be performed.

A CD uniformity (CDU) optimization application 320 obtains a characteristic (e.g. deposition context) of a previous process 304 (e.g. DEP) in the sequence 302 already performed on a wafer.

CDU optimization application 320 obtains a characteristic (exposure context) of a subsequent process 306 (EXP) in the sequence 302 to be performed on the wafer. In this example an etch optimization application 334 also obtains a characteristic (etch context) of another subsequent process 308 (ETC) in the sequence 202 to be performed on the wafer. The CDU optimization application 320 may obtain context of several exposure and etch tools that are available to be used, so that fingerprints may be predicted (as described below) for several potential process threads that might be scheduled through a particular set of tools. The corrections can be determined for the potential process thread with the least severe predicted fingerprints. Alternatively, different corrections can be determined for the different potential process threads and the most practical or effective correction selected.

CDU optimization application 320 determines, using the obtained characteristics, a predicted performance parameter (in this example a fingerprint) of the wafer associated with the sequence of previous 304 and subsequent 306, 308 processes. In this embodiment, this is done by using the obtained context to retrieve measured fingerprints corresponding to the recorded context. Then the retrieved measured fingerprints are combined to produce a predicted fingerprint, given the processes already performed on the wafer and subsequent processes that are to be performed in the future.

In this example, CDU optimization application 320 uses deposition context to query the database 214 (represented by the arrow going from 320 to 214). In response to the query, the deposition fingerprint is retrieved from the database 214 (represented by the arrow going from 214 back to 320).

CDU optimization application 320 uses exposure context to query the database 216 (represented by the arrow going from 320 to 216). In response to the query, the exposure fingerprint is retrieved from the database 216 (represented by the arrow going from 216 back to 320).

Etch optimization application 334 uses etch context to query the database 218 (represented by the arrow going from 334 to 218). In response to the query, the exposure fingerprint is retrieved from the database 218 (represented by the arrow going from 218 back to 334).

Although the CDU optimization application 320 and etch optimization application 334 are described as separate applications, they may be parts of one application, or may themselves be split into several software applications or programs.

The CDU optimization application 320 determines a predicted fingerprint (i.e. a performance parameter) of the wafer associated with the sequence 302 of previous 304 and subsequent 306, 308 processes. Application 320 evaluates the deposition fingerprint 322 and the exposure fingerprint 330. The predicted fingerprint is a linear combination 324 of the deposition 322 and exposure 330 fingerprints. The predicted fingerprint is combined 326 with a dose sensitivity 332 and scanner dose corrections are then calculated 328. In this way, CDU optimization application 320 determines a first correction to a first future process 306 (EXP) in the sequence 302 to be performed on the wafer, based on the determined predicted fingerprint. The correction is applied to the exposure process 306 when the wafer is subjected to that process, as represented by the arrow going from 320 to 306.

The etch optimization application 334 determines a predicted fingerprint (i.e. a performance parameter) of the wafer associated with the sequence 302 of previous 304 and subsequent 306, 308 processes. Application 334 evaluates the etch fingerprint 336. The predicted fingerprint is used to calculate corrections 338 for the future etch process. In this way, etch optimization application 334 determines a second correction to a second future process 308 (ETC), subsequent to the first future process (EXP) in the sequence to be performed on the wafer, based on the determined predicted fingerprint. The correction is applied to the etch process 308 when the wafer is subjected to that process, by transmitting an etch recipe to the etch tool, as represented by the arrow going from 334 to 308.

Figure 4:
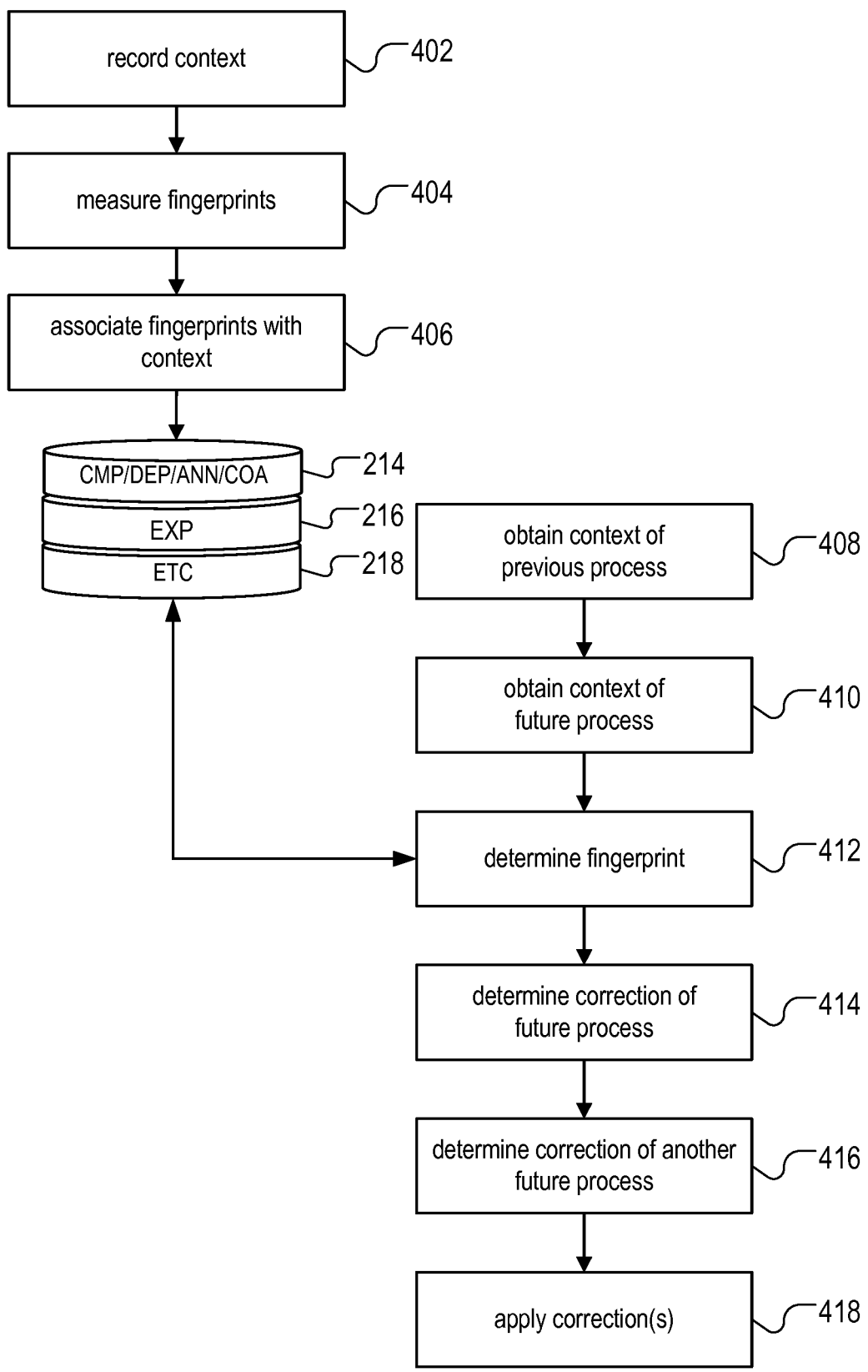
FIG. 4 is a flowchart of a method in accordance with an embodiment of the present invention.

FIG. 4 is a flowchart of a method for optimizing a sequence of processes for manufacturing of product units in accordance with an embodiment of the present invention.

With reference to FIG. 4, and also FIGS. 2 and 3, the method has the steps:

402: Obtaining recorded context of processes 204 (e.g. CMP/DEP/ANN/COA), 206 (EXP) and 208 (ETC) in the sequence 202 performed on many wafers.

404: Obtaining measured fingerprints (i.e. measurement results of performance parameters) for each wafer out of the many wafers, from a metrology tool 210.

406: Associating the measured fingerprints with the respective recorded context. Steps 402 to 406 are described above in relation to FIG. 2. The results are databases 214, 216, 218.

408: Obtaining the context of a previous process 304 (e.g. DEP) in the sequence already performed on a wafer.

410: Obtaining the context of one or more subsequent process 306, 308 (EXP, ETC) in the sequence to be performed on the wafer.

412: Determining, using the obtained context, a predicted fingerprint of the wafer associated with the sequence of previous and subsequent processes. In this embodiment, this is done by using the obtained context to retrieve measured fingerprints corresponding to the recorded context. This step may involve deriving a model from statistical analysis of fingerprints for a plurality of contexts of processes in the sequence.

414: Determining a first correction 328 to a future process 306 (EXP) in the sequence 302 to be performed on the wafer, based on the determined predicted fingerprint.

416: Determining a second correction 338 to a second future process 308 (ETC), which in this example is subsequent to the first future process 306 (EXP), in the sequence 302 to be performed on the wafer, based on the determined predicted fingerprint. The first correction 328 may relate to variation across a plurality of tools (e.g. average) of the predicted fingerprint associated with the second future process 308 (ETC) and the second correction 338 relates to variation of a specific tool (e.g. etch chamber) used in the second future process 308. Thus correction is based on optimally distributed corrections at an individual tool level (here using the scanner and etcher). For example, the scanner may correct average etch fingerprint, while the etcher correction keeps chamber-to-chamber variation close to zero.

418: Applying the determined first 328 and second 338 corrections to processes 306, 308 in the sequence on a wafer. Steps 408 to 418 are described above in relation to FIG. 3.

The advantage of splitting the corrections between the scanner and the etcher is it gives more freedom. It is advantageous to compensate for a certain fingerprint at both the etch stage and at the preceding scanner stage. One could compensate on the etcher which is the last step but then we know that some of these fingerprints cannot be compensated by an etcher. One should consider what can the etcher compensate and what can a scanner compensate. The scanner has most degrees of freedom. For certain fingerprints the etcher is better at compensating. Fortunately, it is also the etcher that may be causing the kind of fingerprint that is to be corrected. If the fingerprint that the etcher is causing is known then that can be compensated for that at the etcher and the fingerprint will tend to zero.

An example of actuating an etcher is by changing the temperature profile in the etch chuck. For CD, it is putting a temperature profile on the chuck. For overlay it is moving an outer ring up or down. That influences the direction of the electrical field at the edge of the wafer. Thus in effect the edge of the wafer is extended with a ring, which is also etched. The height of the ring can be adjusted to match the top of the wafer. By moving the ring up and down the overlay at the edge of the wafer is influenced.

Embodiments thus use both the scanner and etcher tools as actuators, and co-optimize their individual actuation efforts so as to minimize the after-etch fingerprint without a need for specific wafer routing. E.g. the average etcher contribution may be taken into account in the actuation on the scanner. Should the etcher actuation be a limiting factor due to constraints on how much the etch process can be changed, with the average etcher contribution taken care of on the scanner, the etcher would only have to correct for chamber dependent deltas with respect to the average etch contribution.

Embodiments allow estimating deposition tool layer thickness variations on after etch CD without explicitly measuring layer thickness.

The granularity of the corrections can now be on wafer-level instead of lot-level.

Embodiments use context information from multiple fab processing tools like etchers, CMP, RTA, resist spin and coat. The overlay fingerprints generated by these tools on the resist layer can be accurately measured per tool or tool-chamber that is causing the fingerprint.

Advantages of embodiments include giving higher yield, less metrology time due to efficient aggregation of available information, more efficient actuation, and no need for dedicated wafer routing.

A further advantage of the approach is that there is no need for dedicated wafer routing.

An embodiment of the invention may be implemented using a computer program containing one or more sequences of machine-readable instructions describing methods of optimizing a sequence of processes for manufacturing of product units, as described above. This computer program may be executed within a computing apparatus, such as control unit LACU of FIG. 1, or some other controller. There may also be provided a data storage medium (e.g., semi-conductor memory, magnetic or optical disk) having such a computer program stored therein.

Further embodiments of the disclosure are disclosed in the list of numbered clauses below:

1. A method for optimizing a sequence of processes for manufacturing of product units, the method comprising:

(a) obtaining (408) a characteristic of a previous process in the sequence already performed on a product unit;

(b) obtaining (410) a characteristic of a subsequent process in the sequence to be performed on the product unit;

(c) determining (412), using the obtained characteristics, a predicted performance parameter of the product unit associated with the sequence of previous and subsequent processes; and (d) determining (414) a first correction to a first future process in the sequence to be performed on the product unit, based on the determined predicted performance parameter.

2. The method of clause 1, wherein the step (c) of determining a predicted performance parameter comprises deriving a model from statistical analysis of a plurality of measurement results of the performance parameter for a plurality of characteristics of processes in the sequence.

3. The method of clause 1, wherein the step (c) of determining the predicted performance parameter comprises the steps:

(c1) obtaining recorded (402) characteristics of processes in the sequence performed on a plurality of product units;

(c2) obtaining measurement results (404) of performance parameters for each product unit out of the plurality of product units;

(c3) associating (406) the measurement results of the performance parameters with the respective recorded characteristics; and (c4) determining (412) a predicted performance parameter of the product unit associated with the sequence of previous and subsequent processes by using the obtained characteristics to retrieve measurement results of the performance parameters corresponding to the recorded characteristics.

4. The method of any preceding clause, wherein the characteristics comprise context data representing one or more parameters of processing of product units.

5. The method of any preceding clause, wherein the performance parameter comprises a fingerprint of variation across product units of object data representing one or more parameters measured across product units.

6. The method of any preceding clause, further comprising the step of applying the determined first correction to a process in the sequence on a product unit.

7. The method of any preceding clause, further comprising the step of determining (416) a second correction to a second future process in the sequence to be performed on the product unit, based on the determined predicted performance parameter.

8. The method of clause 7, further comprising the step of applying the determined second correction to a process in the sequence on a product unit.

9. The method of clause 7 or clause 8, wherein the first correction relates to variation across a plurality of tools of the determined predicted performance parameter associated with the second future process and the second correction relates to variation of a specific tool.

10. The method of any preceding clause, wherein a product unit is a substrate.

11. The method of any preceding clause, wherein the previous process comprises a process on a product unit selected from the processes: chemical mechanical polishing, deposition, thermal anneal, and resist coat.

12. The method of any preceding clause, wherein the first or second future process comprises exposure of a product unit.

13. The method of any preceding clause, wherein the first or second future process comprises etch of a product unit.

14. A computer program comprising computer readable instructions which, when run on suitable computer apparatus, cause the computer apparatus to perform the method of any of clauses 1 to 13.

15. A computer program product comprising the computer program of clause 14.

Figure 5:
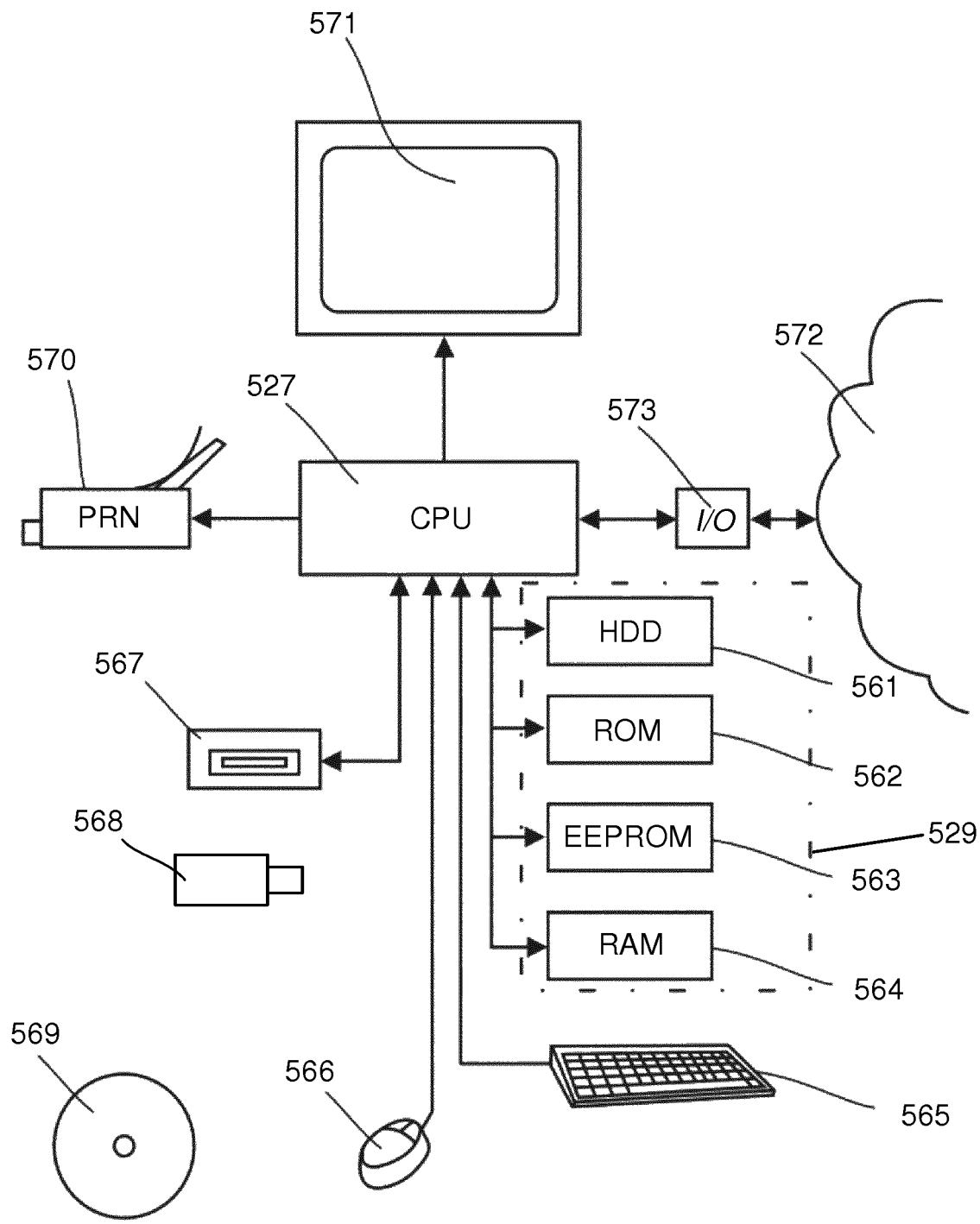
FIG. 5 illustrates computing apparatus useful in implementing the methods disclosed herein.

This control unit LACU may include a computer assembly as shown in FIG. 5. The computer assembly may be a dedicated computer in the form of a control unit in embodiments of the apparatus according to the invention or, alternatively, be a central computer controlling the lithographic apparatus. The computer assembly may be arranged for loading a computer program product comprising computer executable code. This may enable the computer assembly, when the computer program product is downloaded, to control aforementioned uses of a lithographic apparatus with embodiments of the level and alignment sensors AS, LS.

Memory 529 connected to processor 527 may comprise a number of memory components like a hard disk 561, Read Only Memory (ROM) 562, Electrically Erasable Programmable Read Only Memory (EEPROM) 563 and Random Access Memory (RAM) 564. Not all aforementioned memory components need to be present. Furthermore, it is not essential that aforementioned memory components are physically in close proximity to the processor 527 or to each other. They may be located at a distance away.

The processor 527 may also be connected to some kind of user interface, for instance a keyboard 565 or a mouse 566. A touch screen, track ball, speech converter or other interfaces that are known to persons skilled in the art may also be used.

The processor 527 may be connected to a reading unit 567, which is arranged to read data, e.g. in the form of computer executable code, from and under some circumstances store data on a data carrier, like a solid-state drive 568 or a CDROM 569. Also DVD's or other data carriers known to persons skilled in the art may be used.

The processor 527 may also be connected to a printer 570 to print out output data on paper as well as to a display 571, for instance a monitor or LCD (Liquid Crystal Display), of any other type of display known to a person skilled in the art.

The processor 527 may be connected to a communications network 572, for instance a public switched telephone network (PSTN), a local area network (LAN), a wide area network (WAN) etc. by means of transmitters/receivers 573 responsible for input/output (I/O). The processor 527 may be arranged to communicate with other communication systems via the communications network 572. In an embodiment of the invention external computers (not shown), for instance personal computers of operators, can log into the processor 527 via the communications network 572.

The processor 527 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 527 may even be located a distance away of the other processing units and communicate via communications network 572. Connections between modules can be made wired or wireless.

The computer system can be any signal processing system with analogue and/or digital and/or software technology arranged to perform the functions discussed here.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method for optimizing a sequence of processes for manufacturing of product units, the method comprising:
    obtaining a characteristic of a previous process in the sequence already performed on a product unit;
    obtaining a characteristic of a subsequent process in the sequence to be performed on the product unit, wherein the characteristics comprise context data representing one or more parameters of processing of product units;
    determining, by a hardware computer system using the obtained characteristics, a prediction of a performance parameter of the product unit, associated with the sequence of previous and subsequent processes; and
    determining a first correction to a first future process in the sequence to be performed on the product unit, based on the determined prediction.

2. The method of claim 1, wherein the determining a prediction of a performance parameter comprises deriving a model from statistical analysis of a plurality of measurement results of the performance parameter for a plurality of characteristics of processes in the sequence.

3. The method of claim 1, wherein the determining a prediction of a performance parameter comprises:
    obtaining recorded characteristics of processes in the sequence performed on a plurality of product units;
    obtaining measurement results of performance parameters for each product unit out of the plurality of product units;
    associating the measurement results of the performance parameters with the respective recorded characteristics; and
    determining a prediction of the performance parameter of the product unit, associated with the sequence of previous and subsequent processes by using the obtained characteristics to retrieve measurement results of the performance parameters corresponding to the recorded characteristics.

4. The method of claim 1, wherein the performance parameter comprises a fingerprint of variation, across product units, of object data representing one or more parameters measured across product units.

5. The method of claim 1, further comprising applying the determined first correction to a process in the sequence on a product unit.

6. The method of claim 1, further comprising determining a second correction to a second future process in the sequence to be performed on the product unit, based on the determined prediction.

7. The method of claim 6, further comprising applying the determined second correction to a process in the sequence on a product unit.

8. The method of claim 6, wherein the first correction relates to variation across a plurality of tools of the determined prediction associated with the second future process and the second correction relates to variation of a specific tool.

9. The method of claim 1, wherein a product unit is a substrate.

10. The method of claim 1, wherein the previous process comprises a process on a product unit, the process selected from: chemical mechanical polishing, deposition, thermal annealing, and/or resist coating.

11. The method of claim 1, wherein the first future process comprises exposure of a product unit.

12. The method of claim 1, wherein the first future process comprises etch of a product unit.

13. A non-transitory computer program product comprising instructions therein, the instructions, upon execution by a computer system, configured to cause the computer system to at least:
- obtain a characteristic of a previous process in a sequence of processes for manufacturing of product units, already performed on a product unit;
- obtain a characteristic of a subsequent process in the sequence to be performed on the product unit, wherein the characteristics comprise context data representing one or more parameters of processing of product units;
- determine, using the obtained characteristics, a prediction of a performance parameter of the product unit, associated with the sequence of previous and subsequent processes; and
- determine a first correction to a first future process in the sequence to be performed on the product unit, based on the determined prediction.

14. The computer program product of claim 13, wherein the instructions configured to determine a prediction of a performance parameter are further configured to cause the computer system to derive a model from statistical analysis of a plurality of measurement results of the performance parameter for a plurality of characteristics of processes in the sequence.

15. The computer program product of claim 13, wherein the instructions configured to determine a prediction of a performance parameter are further configured to cause the computer system to:
- obtain recorded characteristics of processes in the sequence performed on a plurality of product units;
- obtain measurement results of performance parameters for each product unit out of the plurality of product units;
- associate the measurement results of the performance parameters with the respective recorded characteristics; and
- determine a prediction of the performance parameter of the product unit, associated with the sequence of previous and subsequent processes by using the obtained characteristics to retrieve measurement results of the performance parameters corresponding to the recorded characteristics.

16. The computer program product of claim 13, wherein the performance parameter comprises a fingerprint of variation, across product units, of object data representing one or more parameters measured across product units.

17. The computer program product of claim 16, wherein the instructions are further configured to cause the computer system to apply the determined second correction to a process in the sequence on a product unit.

18. The computer program product of claim 13, wherein the instructions are further configured to cause the computer system to apply the determined first correction to a process in the sequence on a product unit.

19. The computer program product of claim 13, wherein the instructions are further configured to cause the computer system to determine a second correction to a second future process in the sequence to be performed on the product unit, based on the determined prediction.

20. The computer program product of claim 13, wherein the previous process comprises a process on a product unit, the process selected from: chemical mechanical polishing, deposition, thermal annealing, and/or resist coating, and/or the first process comprises exposure of a product unit and/or etch of a product unit.

21. A non-transitory computer program product comprising instructions therein, the instructions, upon execution by a computer system, configured to cause the computer system to at least:
- obtain a characteristic of a previous process in a sequence of processes for manufacturing of product units, already performed on a product unit;
- obtain a characteristic of a subsequent process in the sequence to be performed on the product unit;
- determine, using the obtained characteristics, a prediction of a performance parameter of the product unit, associated with the sequence of previous and subsequent processes, wherein the instructions configured to determine a prediction of a performance parameter are further configured to cause the computer system to derive a model from statistical analysis of a plurality of measurement results of the performance parameter for a plurality of characteristics of processes in the sequence; and
- determine a first correction to a first future process in the sequence to be performed on the product unit, based on the determined prediction.

* * * * *